United States Patent
Weigand

(10) Patent No.: US 7,439,610 B2
(45) Date of Patent: Oct. 21, 2008

(54) HIGH POWER SHUNT SWITCH WITH HIGH ISOLATION AND EASE OF ASSEMBLY

(75) Inventor: Christopher D. Weigand, Andover, MA (US)

(73) Assignee: M/A-COM, Inc., Lowell, MA (US)

( * ) Notice: Subject to any disclaimer, the term of this patent is extended or adjusted under 35 U.S.C. 154(b) by 177 days.

(21) Appl. No.: 11/455,067

(22) Filed: Jun. 16, 2006

(65) Prior Publication Data

US 2007/0290304 A1  Dec. 20, 2007

(51) Int. Cl.
H01L 23/495 (2006.01)
(52) U.S. Cl. .................... 257/666; 257/676
(58) Field of Classification Search .............. 257/678, 257/666, 676
See application file for complete search history.

(56) References Cited

U.S. PATENT DOCUMENTS

| | | | |
|---|---|---|---|
| 4,490,694 A | 12/1984 | Godbout | |
| 4,768,004 A | 8/1988 | Wilson | |
| 4,990,996 A | 2/1991 | Kumar et al. | |
| 5,109,205 A | 4/1992 | Hart et al. | |
| 5,257,411 A | 10/1993 | Minasi | |
| 5,530,285 A | 6/1996 | Brenndoerfer | |
| 5,557,144 A | 9/1996 | Rosenstock et al. | |
| 5,646,831 A | 7/1997 | Manteghi | |
| 5,800,958 A | 9/1998 | Manteghi | |
| 6,014,066 A | 1/2000 | Harberts et al. | |
| 6,777,788 B1 | 8/2004 | Wan et al. | |
| 2003/0057529 A1 | 3/2003 | Ikenaga | |
| 2004/0207054 A1 | 10/2004 | Brown et al. | |
| 2005/0173793 A1 | 8/2005 | Rohrmoser et al. | |

Primary Examiner—Roy K Potter

(57) ABSTRACT

A high power shunt switch comprises a leadframe including a paddle for supporting a shunt element, and a plurality of bond pads located around a periphery of the paddle, wherein at least a first subset of the bond pads are aligned in a substantially straight-line configuration. A shunt element is fixedly attached to the paddle and wire bonded to a top surface of one the bond pads. An encapsulant is disposed on the paddle, the shunt element, the plurality of bond pads, and the wire bond, thereby forming an encapsulated package structure. The package structure is positioned and attached to a transmission line such that the bottom surfaces of each of the at least first subset of bond pads are in simultaneous contact with the transmission line. The package structure and the transmission line are fixedly attached to a suitable substrate.

17 Claims, 4 Drawing Sheets

HIGH POWER SHUNT SWITCH WITH HIGH ISOLATION AND EASE OF ASSEMBLY

FIELD OF INVENTION

The present invention relates generally to a high power shunt switches. More particularly, the present invention relates to a method and apparatus for providing a package structure for use in high power shunt switch applications.

BACKGROUND

High-power switches are typically fabricated using shunt-connected diodes. As known to those skilled in the art, shunt-connected diodes are preferred in high power switch applications because they provide high-isolation when in an ON state, minimize losses when in an OFF state, and because of their cost effectiveness as compared to mechanical switches.

In conventional applications, diodes may be mounted to substrates, such as printed circuit boards (PCBs), using a chip-on-board (COB) mounting scheme. Chip-On-Board is essentially the attachment of a die, in this case a diode, directly onto the surface of a PCB. Electrical contacts of the diode are wire bonded to conductors on the PCB. An encapsulant is then disposed onto the attached diode and wire bonds to protect them from mechanical damage. Unlike packaged diodes, as further discussed below, a COB-mounted diode does not suffer from packaging parasitics. There are, however, significant disadvantages associated with COB-mounted diodes. For example, since wire bonds are exposed during most of the COB assembly process, the wire bonds routinely become damaged, making the already expensive COB assembly process even costlier. Additionally, since the number of components that may be mounted near COB-mounted diodes is limited, relatively large PCBs are required. For these and other reasons, the industry has gone away from COB-mounted diodes and towards packaged diodes.

Packaged diodes, as their name implies, are diodes that are pre-packaged in an encapsulating material. Packaged diodes are much easier to handle, easier to manufacture without risk of damage, and thus, less expensive than their unpackaged counterparts. A typical packaged diode is illustrated in FIG. 1, wherein a PIN diode 100 is shown encapsulated in a low-cost, surface mount plastic package 110. This particular plastic diode package 110 is shown having three (3) leads 120 protruding therefrom, which are bent down and used to surface-mount the diode 100 onto a PC board (not shown).

As indicated above, packaged diodes have distinct advantages over to non-packaged, COB-mounted diodes. Packaged diodes, however, also have their own set of drawbacks. One of the most recognized drawbacks of packaged diodes is the existence of 'package parasitics'. Package parasitics are unwanted electrical and mechanical attributes that result from the physical construction of the package itself. Once such unwanted parasitic is inductance. As known to those skilled in the art, ground inductance in shunt switching elements decreases the isolation in a radio frequency (RF) switch. In packaged PIN diodes, such as is illustrated in FIG. 1, there is a connection between the PIN diode 100 inside the package 110 and an exterior package termination (i.e., feed) 120. Since this connection is conductive, there will always be an inductance associated with the connection. This inductance limits the isolation of the packaged diode 100, particularly at high frequencies, which results in reduced overall performance.

Accordingly, it is desirable to have a method and apparatus for providing a low-parasitic, high isolation package structure, particularly for use in high power switch applications, which is easy and cost-effective to manufacture.

SUMMARY OF THE INVENTION

The present invention relates to a high power shunt switch comprising a leadframe that includes a paddle for supporting a shunt element, and a plurality of bond pads located around a periphery of the paddle, wherein at least a first subset of the bond pads are aligned in a substantially straight-line configuration. A shunt element is fixedly attached to the paddle and wire bonded to a top surface of one the bond pads. An encapsulant is disposed on the paddle, the shunt element, the plurality of bond pads, and the wire bond, thereby forming an encapsulated package structure. The package structure is positioned and attached to a transmission line such that the bottom surfaces of each of the at least first subset of bond pads are in simultaneous contact with the transmission line. The package structure and the transmission line are fixedly attached to a suitable substrate.

In addition, the present invention relates to a method of providing a high power shunt switch comprising providing a leadframe including a paddle for supporting a shunt element, and a plurality of bond pads located around a periphery of the paddle, wherein at least a first subset of the bond pads are aligned in a substantially straight-line. Next, the method recites fixedly attaching a shunt element to the paddle and wire bonding the shunt element to one of the at least first subset of bond pads. Once the shunt element is wire bonded to a bond pad, the paddle, the shunt element, the plurality of bond pads, and the wire bond are encapsulated with a suitable encapsulant, thereby forming a package structure. The package structure is then positioned onto a transmission line such that a bottom surface of each of the at least first subset of bond pads is in simultaneous contact with the transmission line. Finally, the package structure is reflow soldered to a suitable substrate.

BRIEF DESCRIPTION OF THE DRAWINGS

The present invention is best understood from a reading of the following detailed description, taken in conjunction with the accompanying figures in the drawings wherein.

DETAILED DESCRIPTION OF THE PREFERRED EMBODIMENTS

Described herein is a novel lead-less package structure for use in high power shunt switch applications. Unlike existing packages, the package structure of the present invention offers high isolation, ease of assembly, and low package parasitics. In addition, the present invention provides a flexible design that may be modified according to the particular implementation for improved power handling and isolation.

In a preferred embodiment, the package structure of the present invention comprises a leadframe that includes a paddle and a plurality of bond pads, a shunt element, a wire bond and an encapsulant. The leadframe is positioned such that the paddle is located along a center portion of the package. Preferably, the paddle is configured to extend from one end of the package to another end. The plurality of bond pads are preferably located about a periphery of the leadframe, with one-half of the bond pads positioned in a substantially straight line on either side of the paddle. As further discussed below, this straight-line positioning helps maintain a desired impedance of a transmission line.

The shunt element is positioned on a top surface of the paddle where it is supported. Any appropriate shunt element, such as a PIN diode or a NIP diode, may be utilized in accordance with the present invention. In addition, as further discussed below, any appropriate semiconductor device, such as a field-effect transistor (FET) or a metal-semiconductor FET (MESFET), may be utilized (rather than a diode) in accordance with the present invention.

The wire bond bonds the shunt element to one of the bond pads and the entire package, including the paddle, shunt element, wire bond, and bond pads, is encapsulated with an appropriate encapsulant. The encapsulated package is then placed onto a substrate such that the bonded pad and a subset of the remaining pads are in simultaneous contact with a transmission line. The encapsulated package is then reflowed or soldered to the substrate. Depending on the application, the package structure of the present invention may include any number of bond pads, may comprise two or more diodes, or may be implemented in multiple quantities with spacing in between.

In addition, the package structure of the present invention may be embodied as any appropriate package type, depending to the particular implementation. For purposes of illustration, a plastic quad flat no-lead (PQFN) package structure is utilized in describing the present invention. It is envisioned, however, that other similar package structures, such as a land grid array (LGA) package, a ball grid array (BGA) packages, etc. may be utilized in accordance with the present invention. As further detailed below, it is not the type of package structure, but rather the placement of the package structure leads onto a transmission line and the maintenance of a low inductance path from a shunt element bond to that transmission line that are key to the present invention.

Figure 1:
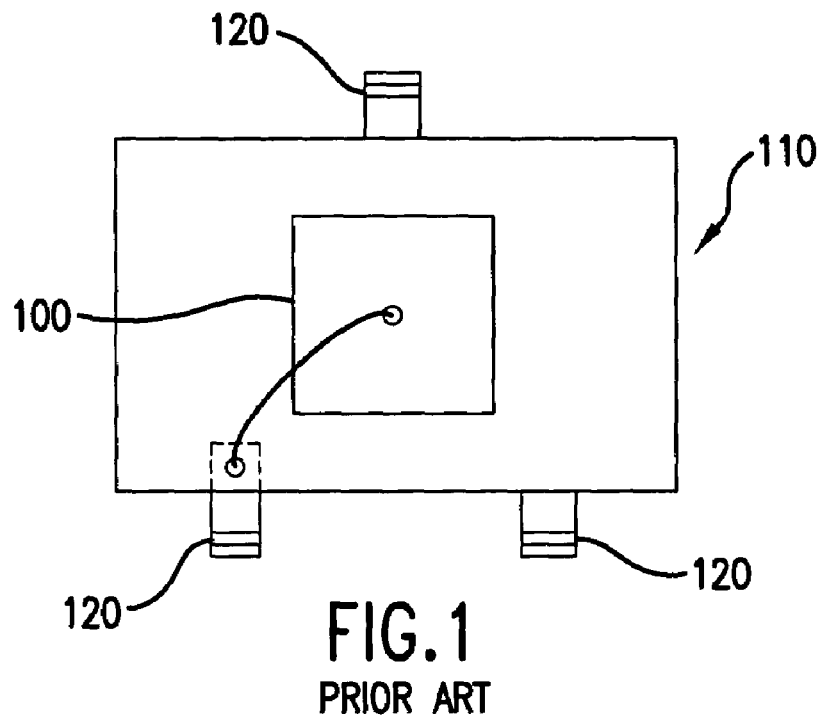
FIG. 1 illustrates a conventional diode package.
Figure 2A:
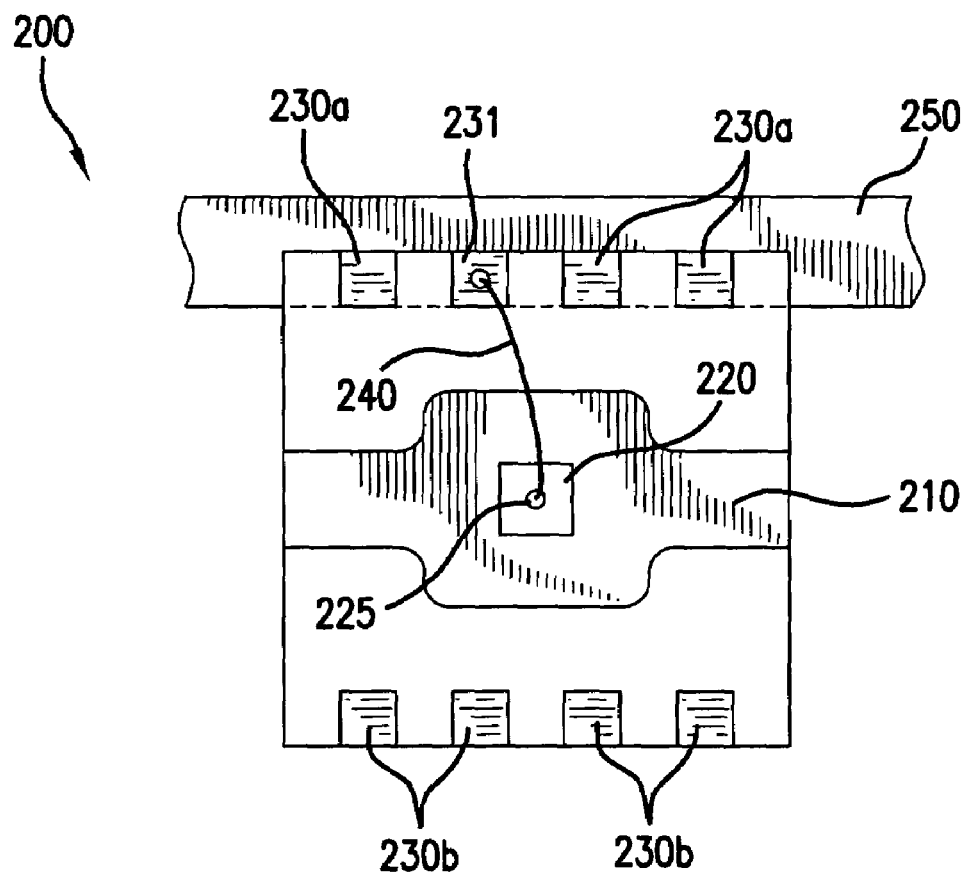
FIG. 2A illustrates a top view of a packaged shunt element in accordance with the present invention.
Figure 2B:
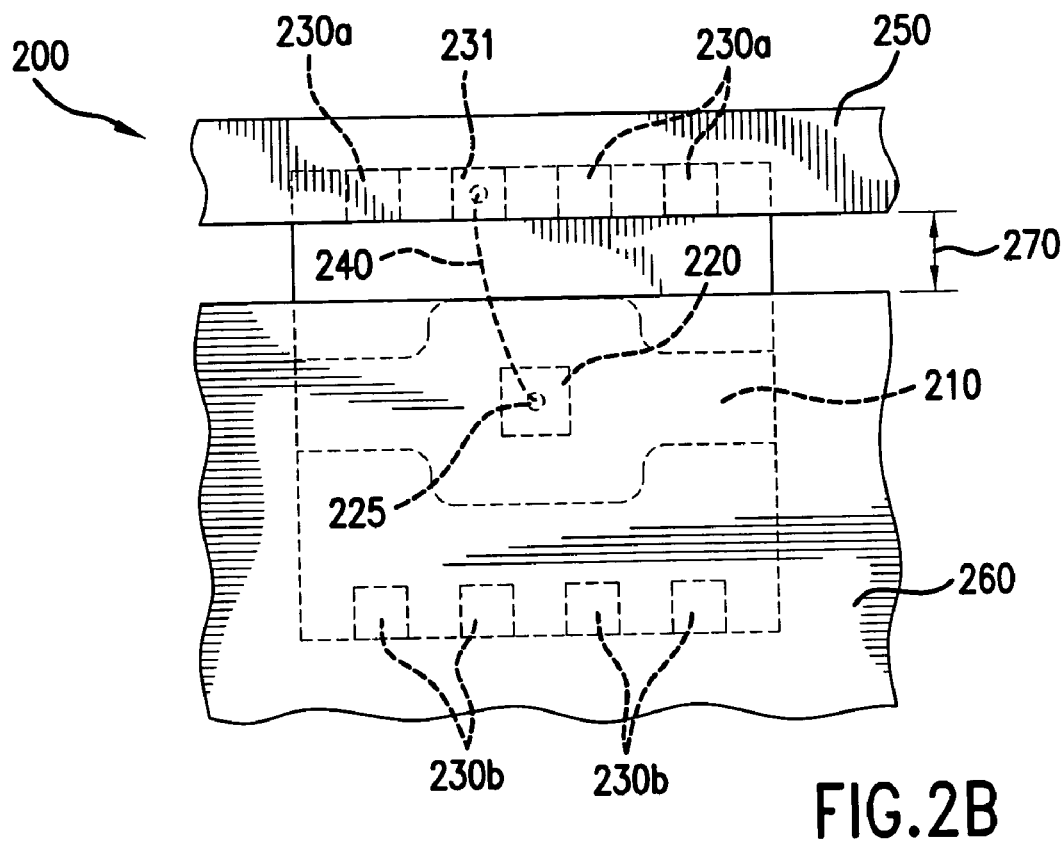
FIG. 2B illustrates a bottom view of a packaged shunt element in accordance with the present invention.

Referring now to FIGS. 2A and 2B, top and bottom views, respectively, of an exemplary embodiment of a package structure 200 embodying a diode in accordance with the present invention are shown. The package structure 200 comprises a leadframe including paddle 210 and a plurality of no-lead bond pads 230, 231, a diode 220 having a diode mesa 225, and a wire bond 240. These package elements are all encapsulated with an appropriate encapsulant, e.g., plastic, disposed on the paddle 210, the diode 220, the bond pads 230, 231, and the wire bond 240, thereby forming a plastic quad-flat no-lead (PQFN) package.

The leadframe is positioned such that the paddle 210 is located along the center of the package structure 200 and preferably extends from one end of the package structure 200 to the other. Affixed to the paddle 210 is the diode 220. The diode 220 may be affixed to the paddle via, for example, the diode's cathode if the diode 220 is a PIN, or the diode's anode if the diode 220 is a NIP. Any appropriate adhesion means, such as epoxy, solder, or the like may be utilized to affix the diode 220 to the paddle 210. The diode 220 of the present package structure 200 is preferably a high power shunt element, such as a PIN diode or a NIP diode. Alternatively, a shunt transistor element such as, for example, a MESFET may be substituted for the diode 220.

The wire bond 240 connects the diode 220 via the diode mesa 225 to one of the bond pads 230, hereinafter "the bonded pad 231". As shown in FIGS. 2A and 2B, the bonded pad 231 is but one of a plurality of bond pads 230 located around a periphery of the package structure 200. In the present configuration, there are a total of eight (8) bond pads 230 including the bonded pad 231, four (4) each on either side of the paddle 210. It should be understood, however, that the package structure 200 of the present invention may be configured with any number of bonds pads as deemed appropriate by the particular implementation.

Referring again to FIGS. 2A and 2B, the bonded pad 231 is shown aligned next to three (3) bond pads 230a in a substantially straight line. As further detailed below, this straight-line alignment facilitates an effective electrical connection between the diode 220 and a transmission line 250 that is located on a substrate or printed circuit board (not shown).

Referring now to FIG. 2B, a bottom view of the encapsulated package structure 200 positioned onto the transmission line 250 is shown. The placement of the diode package structure 200 is such that the transmission line 250 effectively contacts the bottom surfaces of the first group of bond pads 230a, including the bonded pad 231. The transmission line 250 does not, however, contact the package structure's 200 non-metallization zone 270, known to those skilled in the art as a dielectric gap 270. Since the diode 220 is connected to the bonded pad 231, such package placement creates an electrical connection between the diode 220 and the transmission line 250 at four points of contact. Electrically speaking, this type of connection is equivalent to bonding the diode 220 directly to the transmission line 250. As can be appreciated by those skilled in the art, having multiple points of contact provides the benefits of a chip-on-board COB) design, but with the added protection of the package structure. Furthermore, avoiding contact with the dielectric gap 270 enables an accurate calculation of the impedance of the transmission line 250.

The transmission line 250 described above is preferably a grounded coplanar waveguide transmission line, although a microstrip, or any other appropriate type of line may be utilized in accordance with the present invention. In the present configuration, the width of the transmission line 250 may be maintained at its nominal width. As a result, the transmission line's 250 impedance is not compromised. As known to those skilled in the art, if the width of the transmission line 250 is not maintained, the resulting voltage standing wave ratio (VSWR) would lead to reduced isolation and increased insertion loss.

As further illustrated by FIG. 2B, the bottom of the package structure 200, excluding the first sub-group of bond pads 230a, the bonded pad 231, and the dielectric gap 270, are placed in contact with a ground plane 260 of a substrate (not shown). In this regard, the ground plane 260 is preferably made of copper, and is flooded across the paddle 210 and bond pads 230b, thereby providing a preferred radio frequency ground as well as a desirable thermal path from the diode 220 to the ground plane.

Figure 3:
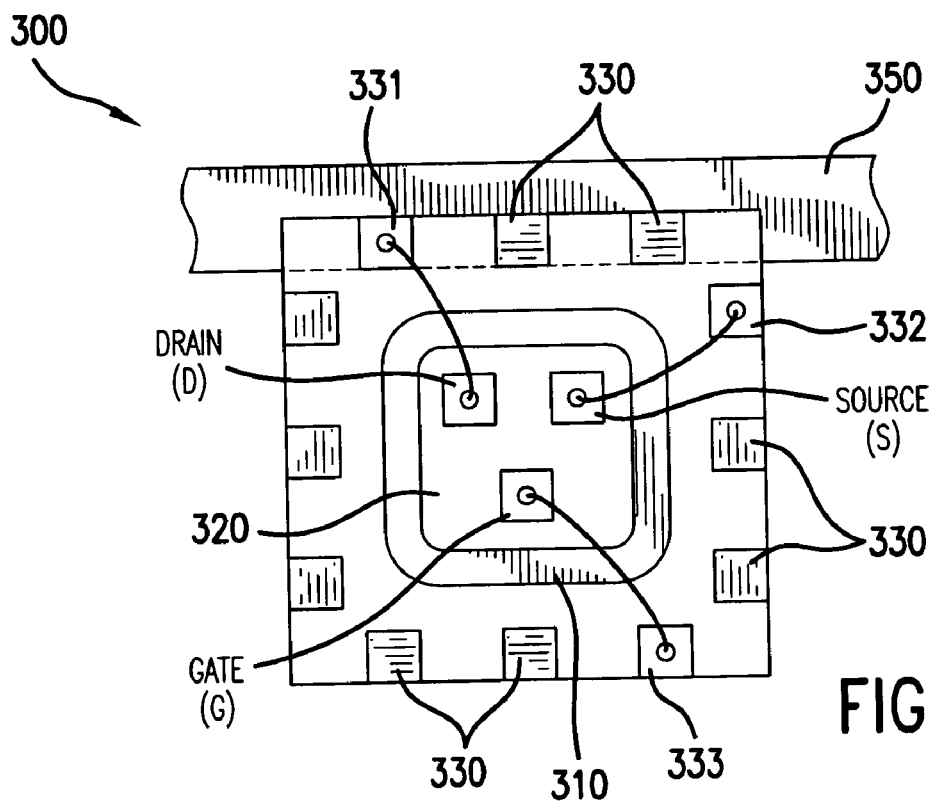
FIG. 3 illustrates a packaged transistor shunt element in accordance with the present invention.

Referring now to FIG. 3, an exemplary package structure 300 utilizing a MESFET rather than a diode is shown. The MESFET package structure 300 comprises a leadframe including paddle 310 and a plurality of no-lead bond pads 330, 331, 332, 333, a MESFET 320 having a gate (G), drain (D), and source (S). These package elements are all encapsulated with an appropriate encapsulant, e.g. plastic, disposed on the paddle 310, the MESFET 320, the bond pads 330-333, and wire bonds used to connect the MESFET to respective bond pads 331-333, thereby forming a plastic quad-flat no-lead (PQFN) package. As known to those skilled in the art, the source (S) and drain (D) of the MESFET 320 are interchangeable when the MESFET 320 is used in, for example, switching applications. Thus, the embodiment of FIG. 3 is solely for illustrative purposes and is therefore, not intended to be limiting.

The leadframe is positioned such that the paddle 310 is located along the center of the package structure 300. Affixed to the paddle 310 is the MESFET 320. The MESFET 320 may be affixed to the paddle 310 via any appropriate adhesion means, such as epoxy, solder, or the like.

As shown in FIG. 3, the package structure 300 of the present embodiment has twelve (12) bond pads located around a periphery of the package 300. As discussed above, the PQFN package of the present invention may be comprise any number of bonds pads in any configuration deemed appropriate by the particular implementation.

Wire bonds connect the MESFET 320 drain (D) to one of the bond pads 331, the MESFET 320 source (S) to a second of the bond pads 332, and the MESFET gate (G) to a third of the bond pad 333. Alternatively, the source (S) of the MESFET 320 may be directly connected to a substrate ground plane (not shown) through a via (not shown). As known to those skilled in the art, directly connecting the source (S) to ground through a via reduces inductance.

Referring again to FIG. 3 the bond pads 330-333 on each side of the package structure 300 are shown aligned in a substantially straight line. This straight-line alignment facilitates an effective electrical connection between the MESFET 320 and a transmission line 350 that is located on a substrate or printed circuit board (not shown) below the package structure 300.

The placement of the MESFET package structure 300 is such that the transmission line 350 effectively contacts the bottom surfaces of a first group of bond pads 330, which includes the pad 331 bonded to the MESFET 320 drain (D). The transmission line 350 does not, however, contact the package structure 300 dielectric gap (not shown). Since the MESFET 320 drain (D) is connected to the bonded pad 331, such package structure placement creates an electrical connection between the MESFET 320 and the transmission line 350 at three points of contact. Electrically speaking, this type of connection is equivalent to bonding the MESFET 320 directly to the transmission line 350. As can be appreciated by those skilled in the art, having multiple points of contact provides the benefits of a chip-on-board (COB) design, but with the added protection of a package.

As discussed above with regard to FIGS. 2A and 2B, the transmission line 350 of the package structure 300 may be a grounded coplanar waveguide transmission line, a microstrip, or any other type of line appropriate for the particular implementation.

Figure 4:
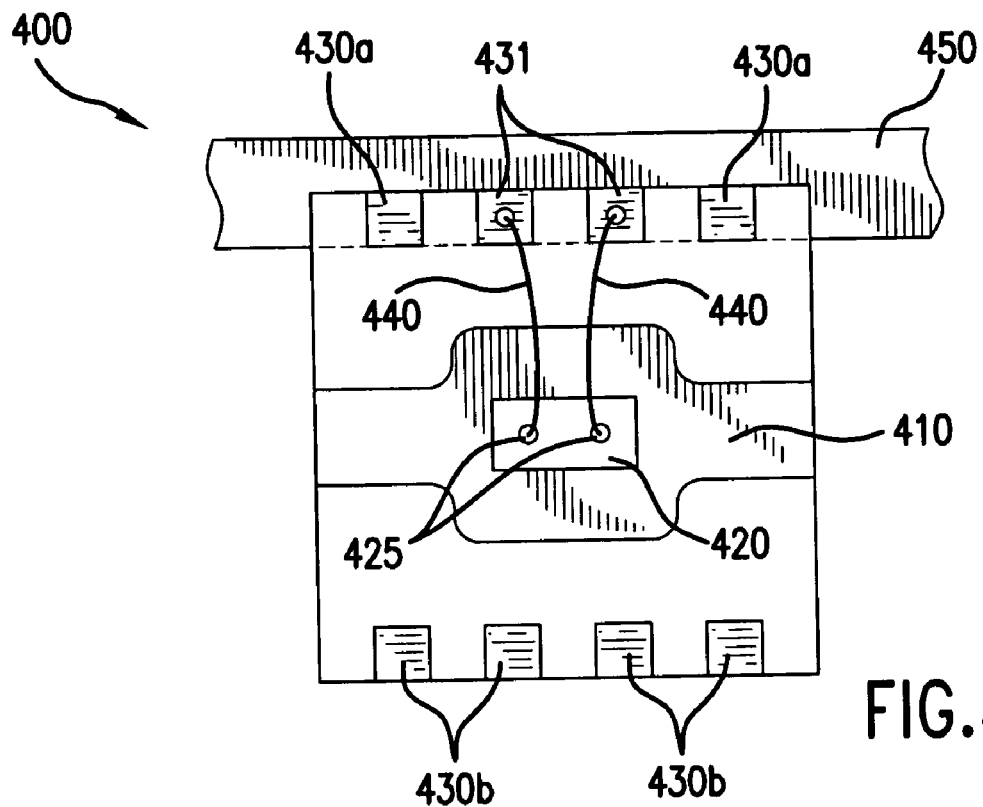
FIG. 4 illustrates a dual-diode shunt element in accordance with the present invention.

Although the exemplary package structures 200, 300 of FIGS. 2A, 2B, and 3 comprise a single element (i.e., a single diode 220 or a single MESFET 320, respectively), it should be understood that where appropriate, two or more elements, such as dual-diodes, may be utilized in a package structure in accordance with the present invention, as shown in FIG. 4.

Referring now to FIG. 4, an exemplary embodiment of a package structure 400 comprising a dual-diode 420 is shown. The package structure 400 also comprises a leadframe including a paddle 410 and a plurality of no-lead bond pads 430, 431, and two wire bonds 440. Similar to the exemplary package structure 200 of FIG. 2, the elements of the present package structure 400 are all encapsulated with an appropriate encapsulant, e.g. plastic, thereby forming a plastic quad-flat no-lead (PQFN) package.

The leadframe is positioned such that the paddle 410 is located along the center of the package structure 400 and preferably extends from one end of the package structure 400 to the other. Affixed to the paddle 410, via epoxy, solder, etc., is the dual-diode 420. The dual-diode 420 of the present package structure 400 is preferably a high power shunt element, such as a PIN or NIP diode. Alternatively, a shunt transistor element, such as a FET or MESFET, may be substituted for the diode 420. Providing a dual-diode 420, as opposed to a conventional single diode, increases the package structure's 400 power handling and isolation. Accordingly, in appropriate applications, this dual-diode 420 package structure 400 may be preferred.

The wire bonds 440 connect the dual-diode 420, via diode mesas 425, to two bond pads 431, one each per mesa 425. These bonded pads 431 are aligned with two other bond pads 430a on the same side of the paddle 410 in a substantially straight line. As described above, this straight-line alignment facilitates an effective electrical connection between the dual-diode 420 and a transmission line 450 located on a substrate or printed circuit board (not shown) under the package structure 400.

As with the exemplary package structure 200 described in FIG. 2, the present package structure 400 is positioned onto the transmission line 450 such that the transmission line 450 effectively contacts the bottom surfaces of a first sub-group of bond pads 430a, including the bonded pads 431. The transmission line 450 does not, however, contact the package structure's 400 dielectric gap (not shown). By connecting the dual-diode 420 to two bonded pads 431, an electrical connection between the dual-diode 420 and the transmission line 450 is consummated. As can be appreciated by those skilled in the art, having four points of contact (i.e., the bottom of the bond pads 430, 431) with the transmission line 450, rather than just a single contact point, (as is conventional in the art), provides for a superior, COB-like electrical connection between the diode 420 and the line 450.

The bottom of the package structure 400, excluding the bond pads (430a, 431) in contact with the transmission line 450 and a designated dielectric gap (not shown), are placed in contact with a ground plane of a substrate (not shown). In this regard, the ground plane (not shown) is preferably made of copper, and is flooded across the paddle 410 and bond pads 430a, 431, thereby providing a preferred radio frequency ground as well as a desirable thermal path from the diode 420 to the ground plane.

Figure 5:
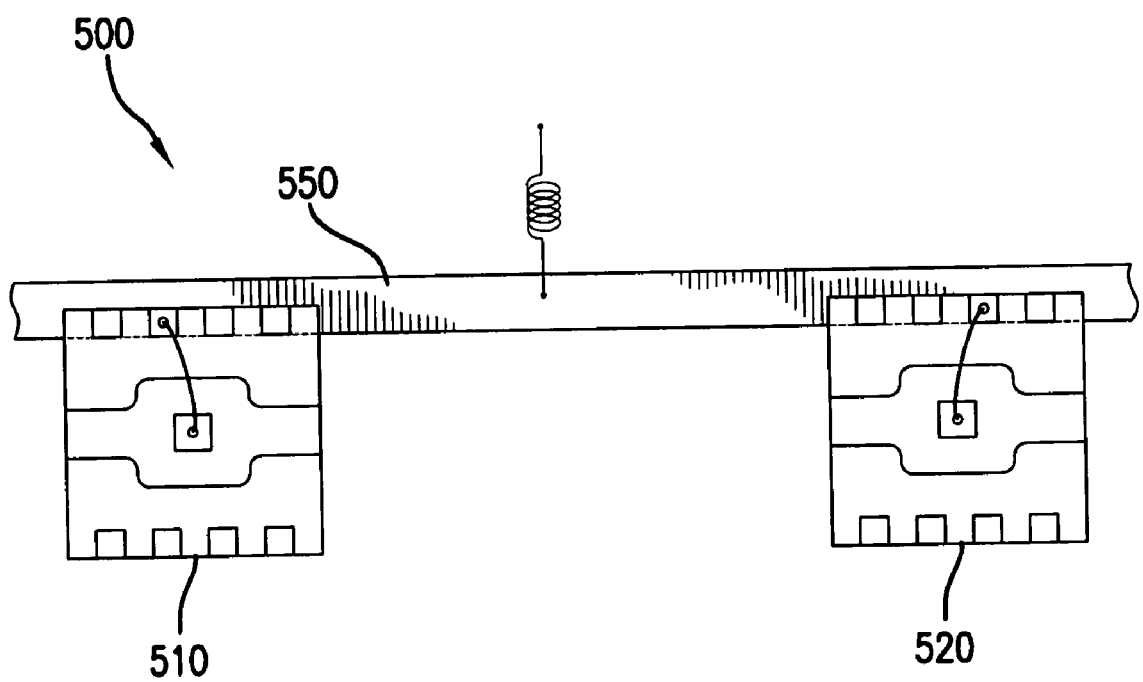
FIG. 5 illustrates a multiple shunt element implementation in accordance with the present invention.

For high power shunt switch implementations requiring improved isolation, spaced package structures in accordance with the present invention may be utilized. Although any number of package structures may be utilized in such applications, no more than three or four should be required. As further detailed below, these spaced package structures may be single-diode packages, as illustrated in FIG. 2, multi-diode packages, as illustrated in FIG. 4, or any combination thereof. To illustrate, reference is now made to FIG. 5, wherein an exemplary embodiment of a high power shunt switch application 500 comprising multiple spaced package structures is shown.

Included in the present embodiment 500 are two package structures 510, 520, each embodying a diode, in accordance with the present invention. These package structures 510, 520 are preferably configured substantially as described above with reference to FIGS. 2 and/or 4. That is, each package structure 510, 520 preferably comprises a leadframe including a paddle and a plurality of bond pads, a diode affixed to the paddle, at least one wire bond for bonding the diode(s) to at least one of the bond pads, and an encapsulant for encapsulating the package structure elements.

As previously described, the bonded pad in each of the package structures 510, 520 is aligned in a substantially straight line with several non-bonded bond pads on the same side of their respective paddles. This straight-line alignment facilitates an effective electrical connection between the diodes and a transmission line 550 located on a substrate or printed circuit board (not shown) under the package structures 510, 520. By positioning the package structures 510, 520 onto the transmission line 550 as illustrated in FIGS. 2 and 4, and now in FIG. 5, an electrical connection between the diodes encased in the package structures 510, 520 and the transmission line 550 akin to a COB connection is consummated. As can be appreciated by those skilled in the art, implementing spaced package structures 510, 520 in the manner described above provides for superior electrical connections to the transmission line 550, while at the same time reducing inductance and providing improved isolation, particularly in high frequency applications.

Figure 6:
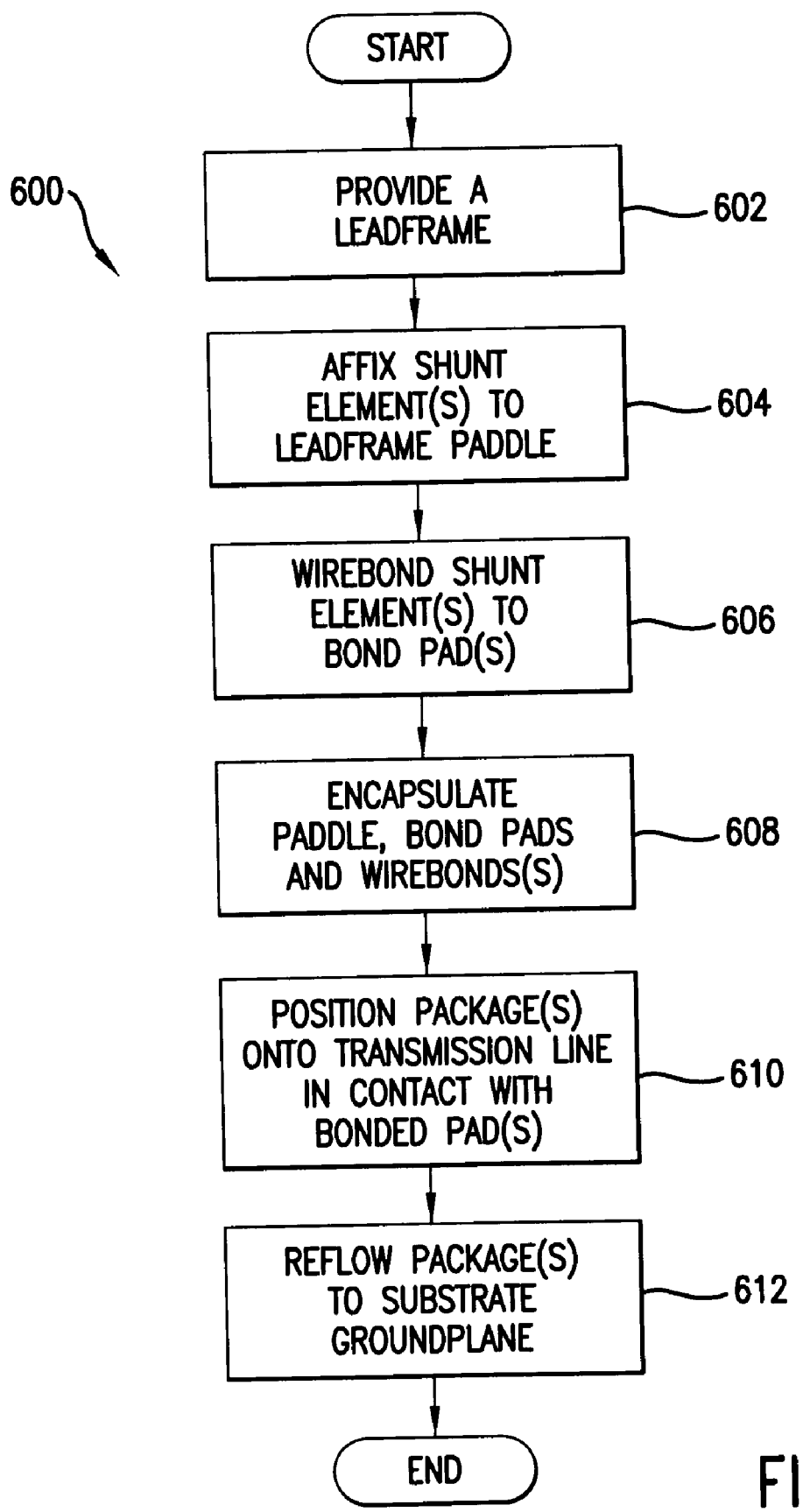
FIG. 6 illustrates a flow diagram of a method of providing a shunt element in accordance with the present invention.

Referring now to FIG. 6, a flow diagram is shown illustrating a method 600 of providing a high power shunt switch with high isolation that is easily assembled. The method 600 begins at step 602, wherein a leadframe including a paddle and a plurality of bond pads is provided. In a preferred implementation, the leadframe comprises eight (8) bond pads, four (4) each positioned in a substantially straight line on either side of the paddle. It should be understood, however, that any number of bond pads in any configuration may be utilized in accordance with the present invention.

Next, a single- or dual-diode or transistor element is provided and affixed to the paddle (step 604) using any appropriate adhesion means, such as epoxy, solder, or the like. In accordance with the present invention, the element is preferably a high power shunt element, such as a PIN diode or a NIP diode. Alternatively, a shunt transistor element, such as a FET or MESFET may be utilized.

Once the shunt element(s) are accordingly attached (step 604), wire bond(s) are utilized to connect the shunt element (s), preferably via a mesa (if applicable), to one of the plurality of bond pads (step 606). In implementations utilizing a dual-shunt element, multiple wire bonds, one each for connecting each shunt sub-element to a corresponding bond pad, is preferably utilized. To illustrate, in an implementation utilizing a dual-diode element having two mesas, two wire bonds are utilized, one each for connecting each sub-element via its respective mesa to a corresponding bond pad. In such an implementation, the bonded bond pads are both located on the same side of the paddle, in a substantially straight line.

An appropriate encapsulant, e.g. plastic, is then disposed onto the paddle, the shunt element(s), the bond pads, and wire bond(s), thereby forming a plastic quad-flat no-lead (PQFN) package structure (step 608). The PQFN package structure is then positioned onto a transmission line (step 610) located on a substrate, printed circuit (PC) board, etc. The positioning of the PQFN package structure is such that the transmission line effectively contacts the bottom surfaces of the bonded pad(s) and of the bond pads positioned in line with the bonded pad(s). The transmission line does not, however, contact the package structure' dielectric gap. In this way, an effective electrical connection between the shunt element and the transmission line, equivalent to a COB connection, is consummated. In an alternate embodiment, multiple PQFN package structures may similarly be positioned and affixed onto a transmission line (step 610), such that each package is at an electrical length from a previously placed package structure.

Once the package structure(s) are properly positioned onto the transmission line (step 610), the package structure(s) are reflowed (i.e., soldered) (step 612) to a substrate ground plain, thereby providing a desirable RF ground and a desirable thermal path from the shunt element(s) to the ground plane.

The invention claimed is:

1. A high power shunt switch comprising:
   a leadframe including paddle for supporting a shunt element, and a plurality of bond pads located around a periphery of the paddle, wherein at least a first subset of the bond pads are aligned in a substantially straight-line configuration;
   a shunt element fixedly attached to the paddle;
   a wire bond for connecting the shunt element to a top surface of one the at least first subset of bond pads;
   an encapsulant disposed on the paddle, the shunt element, the plurality of bond pads, and the wire bond, thereby forming a package structure; and
   a transmission line attached to bottom surfaces of each of the at least first subset of bond pads, thereby forming an electrical connection between the shunt element and the transmission line, wherein the transmission line and package structure are fixedly attached to a suitable substrate.

2. The shunt switch of claim 1, wherein the package structure is one of a plastic quad flat no lead (PQFN) package, a land grid array (LGA) package and a ball grid array (BGA) package.

3. The shunt switch of claim 1, wherein the shunt element is a PIN diode.

4. The shunt switch of claim 1, wherein the shunt element is a NIP diode.

5. The shunt switch of claim 1, wherein the shunt element is a field effect transistor (FET).

6. The shunt switch of claim 1, wherein the shunt element is a metal-semiconductor FET (MESFET).

7. The shunt switch of claim 1, wherein the transmission line is a grounded coplanar waveguide transmission line.

8. The shunt switch of claim 1, wherein the transmission line is a microstrip line.

9. The shunt switch of claim 1, wherein the shunt element is a multi-diode element comprising multiple diodes, the shunt switch element further comprising:
   a plurality of wire bonds, one each for connecting each diode element to a corresponding one of the at least first subset of bond pads.

10. The shunt switch of claim 1, wherein the paddle extends from one end of the package structure to another end of the package structure, and wherein the at least first subset of bond pads is located on one side of the paddle.

11. The shunt switch of claim 1, wherein the plurality of bond pads includes eight (8) bond pads, four (4) of which comprise the at least first subset of bond pads.

12. The shunt switch of claim 1, wherein a bottom surface of the package structure defines a dielectric gap, said dielectric gap being located between the bottom surfaces of the bond pads connected to the transmission line and a bottom surface of the paddle.

13. The shunt switch of claim 12, wherein the package structure is attached to the substrate by reflow soldering the package structure to a ground plain defined on said substrate.

14. The shunt switch of claim 13, further comprising a plurality of package structures, wherein each of the plurality of package structures is positioned and attached to the transmission line at an electrical length from another of the plurality of package structures.

15. The shunt switch of claim 14, wherein at least one of the package structures comprises a multi-diode element, said at least one package structure further comprising:

a plurality of wire bonds, one each for connecting each of the multi-diode elements to a corresponding one of the at least first subset of bond pads.

16. The shunt switch of claim 15, wherein at least one of the package structures comprises eight (8) paddles, four of which comprise the at least first subset of bond pads corresponding to said at least one package structure.

17. The shunt switch of claim 16, wherein the plurality of package structures are attached to the substrate by reflow soldering the package structures to a ground plain defined on said substrate.

* * * * *